United States Patent
Ihlefeld et al.

(10) Patent No.: US 9,909,233 B1
(45) Date of Patent: Mar. 6, 2018

(54) TUNABLE INFRARED REFLECTANCE BY PHONON MODULATION

(71) Applicant: National Technology & Engineering Solutions of Sandia, LLC, Albuquerque, NM (US)

(72) Inventors: Jon F. Ihlefeld, Charlottesville, VA (US); Michael B. Sinclair, Albuquerque, NM (US); Thomas E. Beechem, III, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/711,122

(22) Filed: Sep. 21, 2017

(51) Int. Cl.
| | |
|---|---|
| *H01L 37/00* | (2006.01) |
| *C30B 29/32* | (2006.01) |
| *C30B 29/24* | (2006.01) |
| *C09K 13/00* | (2006.01) |
| *B24B 37/04* | (2012.01) |

(52) U.S. Cl.
CPC ............ *C30B 29/32* (2013.01); *B24B 37/042* (2013.01); *C09K 13/00* (2013.01); *C30B 29/24* (2013.01)

(58) Field of Classification Search
CPC ................................ C30B 29/32; C30B 29/24
USPC ........................................................ 250/338.2
See application file for complete search history.

(56) References Cited

U.S. PATENT DOCUMENTS 9,255,347 B2 * 2/2016 Ihlefeld .................. C09K 13/00

OTHER PUBLICATIONS

Ihlefeld, J. F. et al., "Crystal Coherence Length Effects on the Infrared Optical Response of MgO Thin Films", Applied Physics Letters, 2010, vol. 97, pp. 191913-1-101013-3.
Ihlefeld, J. F. et al., "Room-Temperature Voltage Tunable Phonon Thermal Conductivity via Reconfigurable Interfaces in Ferroelectric Thin Films", Nano Letters, 2015, vol. 15, pp. 1791-1795.
Ehara, Y. et al., "Ultrafast Switching of Ferroelastic Nanodomains in Bilayered Ferroelectric Thin Films", Applied Physics Letters, 2011, vol. 99, pp. 182906-1-182906-3.
Ihlefeld, J. F. et al., "Domain Imaging in Ferroelectric Thin Films Via Channeling-Contrast Backscattered Electron Microscopy" J Mater Sci, 2017, vol. 52, pp. 1071-1081.
Buixaderas, E. et al., "Compositional behavior of Raman-Active Phonons in Pb(Zr1-x Tix)O3 Ceramics", Physical Review, 2015, vol. 91, pp. 014104-1-014104-9.

* cited by examiner

*Primary Examiner* — David Porta
*Assistant Examiner* — Meenakshi Sahu
(74) *Attorney, Agent, or Firm* — Kevin W. Bieg

(57) ABSTRACT

The present invention pertains to the use of mobile coherent interfaces in a ferroelectric material to interact with optical phonons and, ultimately, to affect the material's optical properties. In altering the optical phonon properties, the optical properties of the ferroelectric material in the spectral range near-to the phonon mode frequency can dramatically change. This can result in a facile means to change to the optical response of the ferroelectric material in the infrared.

7 Claims, 5 Drawing Sheets

US 9,909,233 B1

TUNABLE INFRARED REFLECTANCE BY PHONON MODULATION

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to infrared reflectance and, in particular, to the use of mobile coherent interfaces in a ferroelectric material to alter optical phonons and, ultimately, to affect their energy and scattering time, thereby influencing the infrared reflectance of the ferroelectric material.

BACKGROUND OF THE INVENTION

Tuning optical properties in the long wave infrared is typically the domain of semiconductor materials where plasmon-polariton or coupled plasmon-phonon-polariton responses can be modulated by altering carrier concentrations. Less explored is the use of other tunable material-photon interactions to alter optical properties. This is because optical responses in the infrared are typically considered invariable within a specific dielectric material.

Optical phonon energies of many semiconductors are commensurate with the energies of photons within the infrared. Therefore, infrared (IR) photons can couple with near-zero wavevector optical phonons resulting in a band of high reflectivity, commonly denoted the Reststrahlen band, in partially ionic materials. In this band, the real portion of the electric permittivity crosses zero and can become strongly negative. Since the permittivity at these frequencies is described based upon the energies and scattering times of the transverse and longitudinal optical phonons, variations in the phonon response will change the optical response. Previously, it has been shown that limiting the mean free path of optical phonons in an ionic material, magnesium oxide, can change the infrared optical response of the material by affecting phonon-polaritons. In particular, a decrease in crystalline coherence from 47 nm to 5 nm resulted in a 20% reduction in the reflectivity of the material in the IR Reststrahlen band. This was due to a change in the IR dielectric properties near the phonon-polariton resonance arising from variations in the scattering time of the optical phonons. See J. F. Ihlefeld et al., *Appl. Phys. Lett.* 97(19), 191913 (2010).

SUMMARY OF THE INVENTION

The present invention is directed to a method to tune the infrared reflectance of a ferroelectric material, comprising providing at least one ferroelectric layer of a ferroelectric material on a substrate, wherein the at least one ferroelectric layer comprises a plurality of ferroelectric domain walls that are mobile under an applied electric field; and applying an electric field across the at least one ferroelectric layer, thereby altering the volumetric concentration of the plurality of ferroelastic domain walls and causing a shift in the wavelength of a minimum in the infrared reflectance. The ferroelectric material can comprise lead zirconate titanate, lead magnesium niobate-lead titanate, lead lanthanum zirconate titanate, lead niobate zirconate titanate, lead indium niobate-lead titanate, bismuth ferrite, bismuth samarium ferrite, bismuth cobalt ferrite, barium titanate, barium strontium titanate, barium calcium zirconate titanate, barium titanate zirconate, bismuth sodium niobate, or bismuth sodium niobate-barium titanate. At least one ferroelectric layer preferably comprises a ferroelectric bilayer or multilayer heterostructure. A ferroelectric bilayer heterostructure can comprise a rhombohedral symmetry lead zirconate titanate layer and a tetragonal symmetry lead zirconate titanate layer. The thickness of the at least one ferroelectric layer can be less than about 3 microns and, more preferably, hundreds of nanometers. The applied voltage must be less than the dielectric breakdown voltage, which is typically less than about 2 MV/cm in PZT thin films. The invention can further comprise an optical grating, nano-antenna, or metasurface on the surface of the at least one ferroelectric layer.

As an example of the invention, DC electric fields applied across bilayer PZT films were used to alter the optical phonon response and long wave infrared optical response of the base material and simple nanoantenna devices. By applying a field across a PZT bilayer film, the position of the E(LO3) mode in the PZT 20/80 layer shifted toward shorter wavelengths and the breadth of the reflectivity minimum associated with this mode increased. The shift is related to a change in the polarization of the film. The breadth increase is likely due to an increase in the scattering and damping of the E(LO3) phonons. By preparing a gold nanoantenna on the surface of the film and then applying a field using the nanoantenna as an electrode, a reflectivity minimum can be tuned in a relatively narrow band owing to an electro-optic effect in the PZT affecting a surface plasmon polariton at the gold/PZT interface. The approach has advantages over plasmonic tuning approaches in that it allows one to utilize low loss and simple structures to achieve reflectivity tuning in the long wavelength IR.

BRIEF DESCRIPTION OF THE DRAWINGS

The detailed description will refer to the following drawings, wherein like elements are referred to by like numbers.

DETAILED DESCRIPTION OF THE INVENTION

Figure 1A:
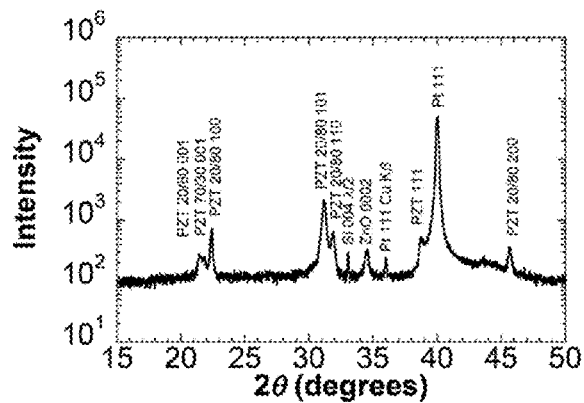
FIG. 1(a) is an X-ray diffraction pattern of a bilayer PZT film.
Figure 1B:
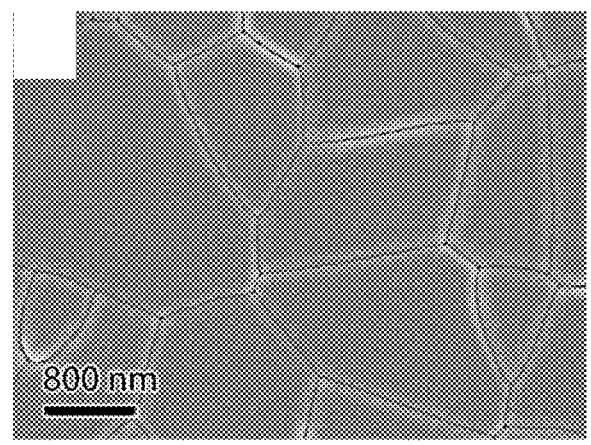
FIG. 1(b) is an in-lens scanning electron micrograph of a bilayer PZT film.

Ferroelectric materials have phonon modes that can be actively affected by external stimuli. According to the present invention, ferroelastic domain walls (domain walls separating non-180 and 0-degree polarization vector regions) in ferroelectric materials are used to determine the energy of optical phonons and their scattering time, as was previously demonstrated for heat-carrying phonons. See J. F. Ihlefeld et al., *Nano Lett.* 15(3), 1791 (2015) and U.S. Pat. No. 9,255,347, which are incorporated herein by reference. The domain structure in the material will change through the application of an electric field or mechanical strain to the ferroelectric material. There are two ways in which the domain structure can change: 1) the domains whose polarization is most well aligned with the applied electric field will grow at the expense of domains that are not well aligned and 2) the material may respond by nucleating more domains. In the former case, the volumetric concentration of the domain walls will decrease as the growing domains impinge upon one another. In the latter case, the volumetric concentration of domain walls will increase.

Domain reorientation alters the optical phonons in two ways, namely the phonon energy and scattering time. When changing the domain structure of the sample, it is possible to change the volume fractions of different types of domains. For example, in a canonical tetragonal ferroelectric, "a" domains are those that have the majority component of their polarization vector aligned in-plane and "c" domains are those that have a polarization vector 90° rotated from the "a" domains. By altering the domain structure, the volumetric concentrations of "a" and "c" domains can change inversely and the position of the phonon mode can change. See Y. Ehara et al., *Appl. Phys. Lett.* 99(18), 182906 (2011). Optical phonon energies dictate the IR permittivity of the material. Changes in the permittivity will result in variations of the IR optical response. Domain structure also dictates the phonon scattering time, which also influences the IR permittivity of the material and thus the IR optical response. For instance, in decreasing the volumetric concentration of domain walls that scatter phonons, the phonon scattering time will increase. Likewise, by increasing the volumetric concentration domain walls that scatter phonons, the scattering time will decrease.

Tuning the IR optical response will therefore be predicated upon domain induced variations in the optical phonon energies and scattering times. Changes in domain structure are thus needed for tunable IR properties. Single layers of ferroelectric material can be used to provide mobile domain walls, although the effect is stronger in bilayer or multilayer heterostructures. The film thickness is preferably hundreds of nanometers, although much thinner films can also be used. Alternatively, this can be achieved in bulk ceramics and single crystals for compositions where domain motion is large. Examples include lead zirconate titanate, with compositions near the morphotropic phase boundary, and lead magnesium niobate-lead titanate, with compositions near the morphotropic phase boundary. However, other ferroelectric materials can be used, such as lead lanthanum zirconate titanate, lead niobate zirconate titanate, lead indium niobate-lead titanate, bismuth ferrite, bismuth samarium ferrite, bismuth cobalt ferrite, barium titanate, barium strontium titanate, barium calcium zirconate titanate, barium titanate zirconate, bismuth sodium niobate, or bismuth sodium niobate-barium titanate.

To amplify the response, optical gratings, nanoantennas, or metasurfaces can be patterned on the surface of the ferroelectric. These enable more efficient coupling of incident light into the ferroelectric material.

Example: Bilayer Lead Zirconate Titanate Thin Films

Ferroelectric bilayer heterostructures comprise bilayer ferroelectric thin films with a compositional heterostructure. As an example of the invention, a bilayer PZT film was prepared by depositing a rhombohedral symmetry $PbZr_{0.7}Ti_{0.3}O_3$ (PZT 70/30) layer on a $Pt/ZnO/SiO_2$/silicon substrate and then depositing a tetragonal symmetry $PbZr_{0.2}Ti_{0.8}O_3$ (PZT 20/80) layer on the PZT 70/30 layer, as previously described. See J. F. Ihlefeld et al., *Nano Lett.* 15(3), 1791 (2015); and J. F. Ihlefeld et al., *J. Mater. Sci.* 52(2), 1071 (2017), which are incorporated herein by reference. Chemical solutions of nominal compositions of PZT 70/30 and PZT 20/80 were prepared via an inverted mixing order approach. See R. A. Assink and R. W. Schwartz, *Chem. Mat.* 5(4), 511 (1993). Briefly, titanium isopropoxide and zirconium-butoxide (80 wt. % in butanol) were reacted in the desired ratio, acetic acid was added as a chelating ligand, and methanol added as a solvent. The solution was heated to 90° C. and lead (IV) acetate added. Upon dissolution of the lead (IV) acetate, the solution was cooled and alternating doses of methanol and acetic acid were added until a final molarity of 0.35 M was achieved. The solutions were spin cast onto platinized silicon wafers at 4000 RPM for 30 s. A single layer of PZT 70/30 was deposited first and pyrolyzed at 450° C. for 1 min. After cooling to room temperature, the PZT 20/80 layer was deposited. PZT 20/80 layer was pyrolyzed at 300° C. for 1 min. After all layers were deposited, a single crystallization anneal was performed at 700° C. for 10 min. Platinum top electrodes were patterned using a shadow mask and were deposited by rf magnetron sputtering. Transparent (i.e. thickness much less than the skin depth of the incident light) platinum electrodes were prepared by offsetting the shadow mask to enable overlap with a thicker platinum electrode. The transparent electrodes were ~3 nm thick. This is thick enough to enable a continuous field to be applied, but thin enough to enable infrared optical transparency.

Figure 1C:
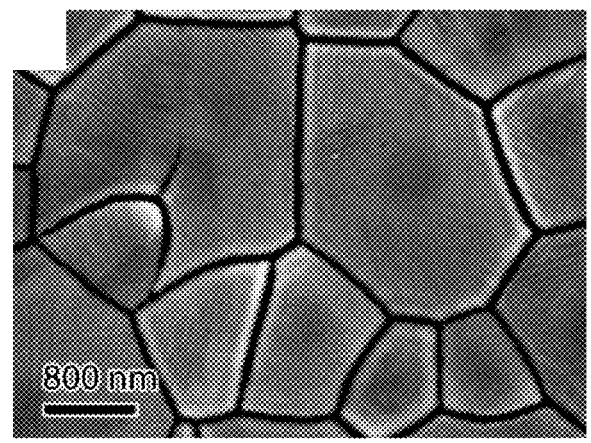
FIG. 1(c) is backscatter scanning electron micrograph of a bilayer PZT film. The striations in FIG. 1(c) are ferroelastic domains.

FIGS. 1(a)-(d) show X-ray diffraction and microstructure of the prepared films. Random crystallographic orientations comprise the film. Grain sizes are typically in excess of 1 μm across in the lateral dimension. Cross-sectional imaging (not shown) reveals the average film thickness to be ~280 nm. As shown in FIG. 1(c), a high density of ferroelastic nano-scale domains are clearly present in the PZT 20/80 top layer of the PZT bilayer film, as indicated by the dark and light contrast striations.

Figure 2:
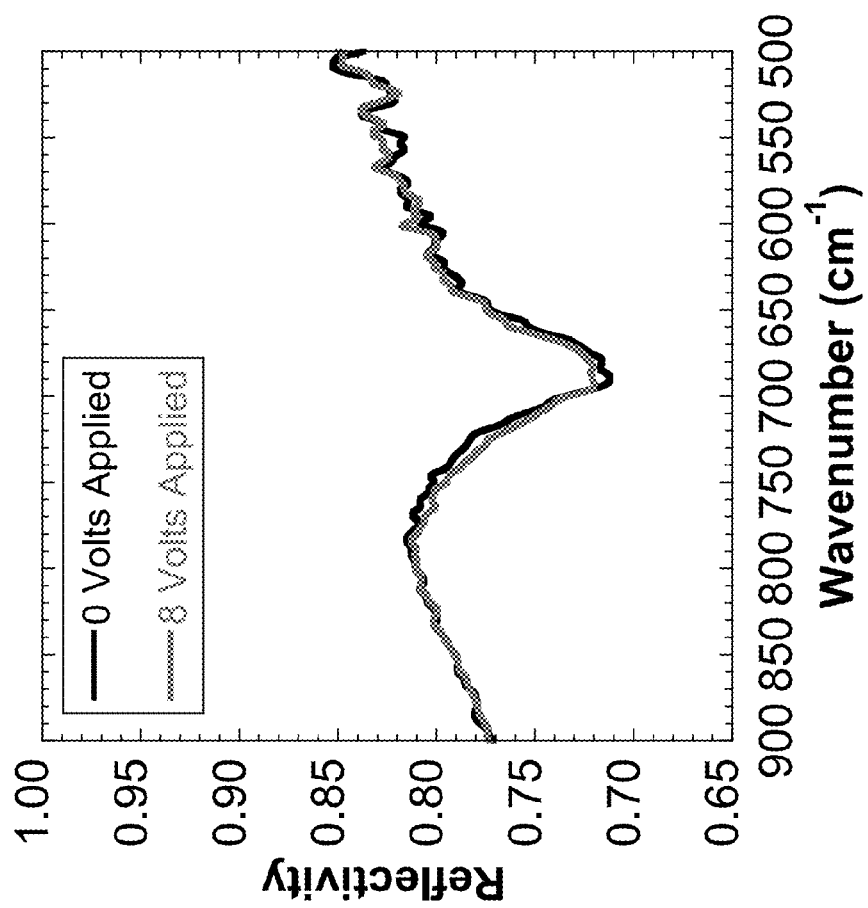
FIG. 2 is a graph of reflectivity of a 3 nm Pt/280 nm bilayer PZT/100 nm Pt thin film heterostructure with and without electric field applied.

FIG. 2 shows the infrared reflectivity of the unpatterned film in the wavenumber range of 900 $cm^{-1}$ to 500 $cm^{-1}$ (wavelength range of 11.1 μm to 20 μm). The incident light was focused onto the thin transparent platinum electrode in both zero bias and 8V applied across the film conditions. In both cases a reflectivity minimum is observed. The location of this minimum corresponds to the wavelength of the E(LO3) mode. See E. Buixaderas et al., *Phys. Rev. B* 91(1), 014104 (2015). Subtle differences in the reflectivity can be observed. First, a shift in the reflectivity minimum toward higher wavenumbers (shorter wavelengths) is observed. Second, the breadth of the reflectivity minimum increases when the field is applied across the sample. This increase is most evident on the longer wavenumber (shorter wavelength) side of the reflectivity minimum.

The observed changes in reflectivity with applied field are consistent with two phenomena: 1) a change in the crystallographic orientation of the films and 2) a change in the scattering of optical phonons while the field is applied. The first effect, of a change in reflectivity minimum position, can be understood by considering a change in the crystal lattice. If the positions of atoms and lengths of bonds change, the phonon mode frequency must also change. The microstructural phenomenon that gives rise to this effect has two components: 1) domain structure changes where the application of an electric field will favor alignment of the polarization vectors with the electric field resulting in a restructuring of domains to align the polar vectors with the applied DC field, and 2) a stretching of bonds while the field is applied. The former can be considered as an extrinsic response and the latter as an intrinsic lattice response. The second effect, the change in breadth of the reflectivity minimum, can be understood by considering the scattering of optical phonons at ferroelastic domain walls. If the application of the DC electric field to the sample causes a change in the spacing of ferroelastic domain walls, and if they are sufficiently close to interact with optical phonons below the Umklapp limit, then the degree of optical phonon damping will change, resulting in a change in the optical reflectivity, similar to the results for MgO films where a decrease in the crystalline coherence length resulted in increased optical phonon damping and an increase in the full width at half maximum of the imaginary, or lossy, component of dielectric function. See J. F. Ihlefeld et al., *Appl. Phys. Lett.* 97(19), 191913 (2010). It has also previously been shown that application of an electric field to similar PZT bilayer films results in an increase in the volumetric concentration of ferroelastic domain walls and a subsequent increase in scattering of heat-carrying phonons. See J. F. Ihlefeld et al., *Nano Lett.* 15(3), 1791 (2015). Therefore, the application of the field across the sample likely resulted in an increase in the concentration of ferroelastic domain walls in the PZT 20/80 layer, which increases the damping of optical phonons, which directly results in an increase in the breadth of the infrared reflectivity minimum in the vicinity of the optical phonon mode.

Figure 3:
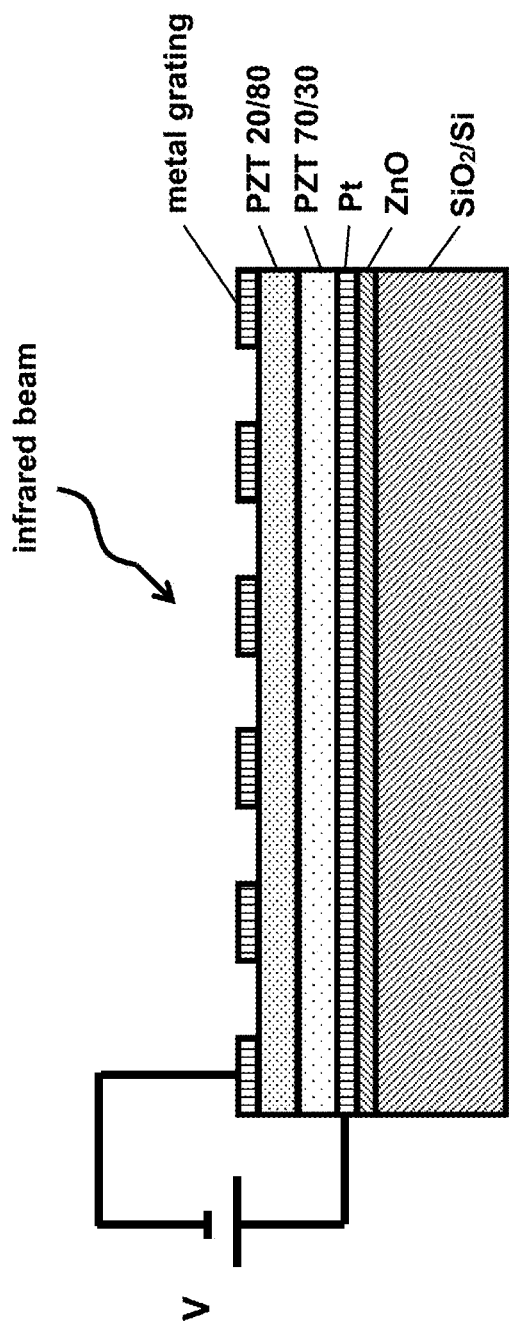
FIG. 3 is a schematic illustration of a ferroelectric bilayer heterostructure with an optical grating on the top surface.

To amplify the response, optical gratings, nanoantennas, or metasurfaces can be patterned on the surface of the ferroelectric. Photolithography was used to form a gold optical grating on the top surface of the PZT bilayer heterostructure, as shown in FIG. 3. The period of the grating was 5 μm and the duty cycle was 0.5. The nano-antenna structure can stabilize a surface plasmon polariton at the nanoantenna/medium interface. In this example, the medium is a PZT bilayer with tunable optical properties owing to tunable phonon modes.

Figure 4:
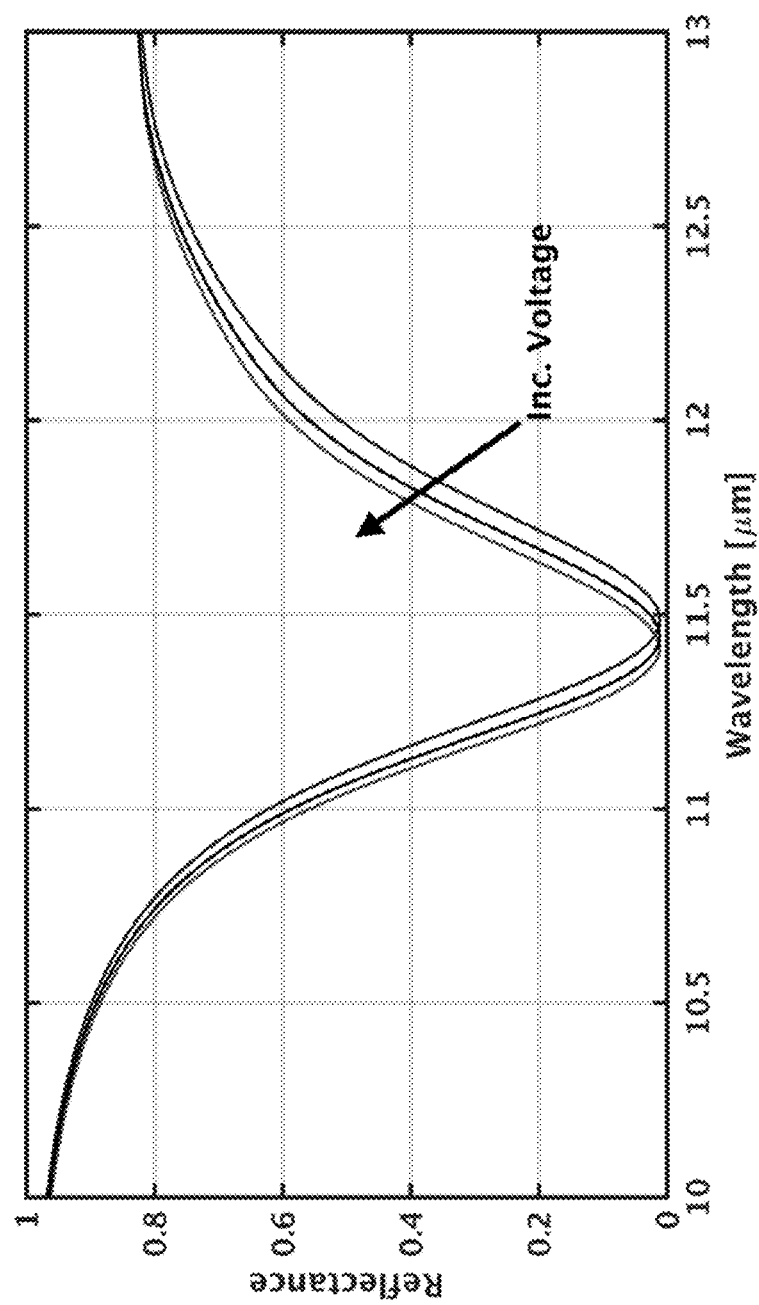
FIG. 4 is a graph of reflectivity of a 280 nm thick bilayer PZT/100 nm Pt thin film heterostructure with a 5 μm 0.5 duty cycle gold grating as the top electrode. The reflectance shifts with applied voltages of 0, 8 and 12V are shown.

FIG. 4 shows the infrared reflectivity for a bilayer PZT film with a gold grating nanoantenna. The reflectivity minimum is the surface plasmon polariton mode at the gold (and bottom Pt)/PZT interface. It can be seen that a shift in the reflectivity minimum toward shorter wavelengths (longer wavenumbers) occurs as the DC field (0, 8, and 12V) is applied to the grating and across the bilayer film. As the PZT crystal changes while the field is applied (changing relative fractions of a- and c-domains, lengthening bonds while the field is applied, and increasing the population of ferroelastic domain walls) the phonon modes necessarily change. Since the phonon modes directly impact the high frequency dielectric properties and refractive index, the surface plasmon polariton at the gold/PZT interface is affected.

Figure 5:
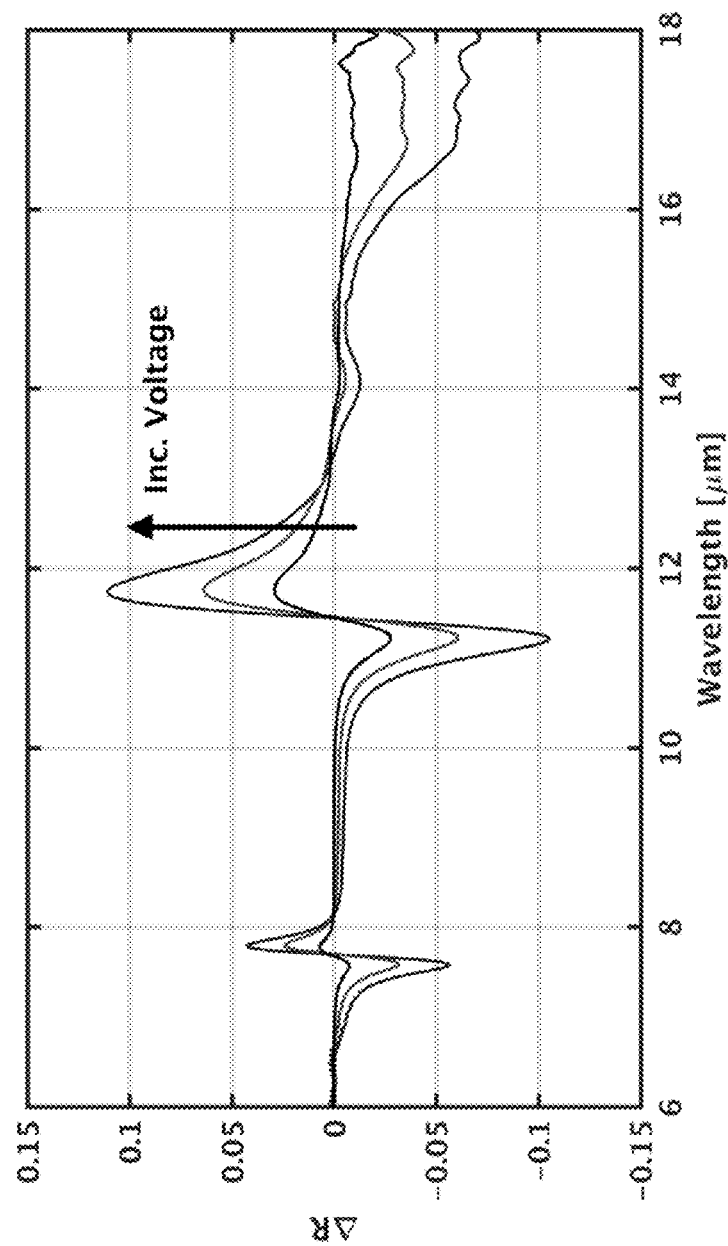
FIG. 5 is a graph of differential reflectance referenced to the no-voltage-applied case for a 5 μm spacing gold grating with a 0.5 duty cycle atop a ~300 nm thick bilayer PZT film with a 100 nm Pt bottom contact. Greater than 10% changes in reflectance are observed as the applied voltage was increased from 0 to 12 V.

Considering the optical reflectance at each wavelength, a change in reflectance with respect to the no-voltage condition can be calculated. This is shown in FIG. 5. A greater than 10% effective tuning of reflectivity can occur in the long-wave IR using just an electric field, and no modulation of charge carrier density.

The tuning observed in the nanoantenna structure is advantageous from a technology perspective. It allows one to take advantage of large optical property changes of the bilayer PZT owing to domain and domain wall reconfiguration, but occurs without needing a plasmonic material to change response. That is, one doesn't need to gate and redistribute charge in a conventional plasmonic material to make a device work. Therefore, this device has the potential to be a tuning mechanism with minimal losses. Further, the structure is more easily fabricated as it does not require a high quality gate dielectric on an exotic semiconductor material.

The present invention has been described as tunable infrared reflectance by varying the optical phonons in ferroelectric materials. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method to tune the infrared reflectance of a ferroelectric material, comprising:
    providing at least one ferroelectric layer of a ferroelectric material on a substrate, wherein the at least one ferroelectric layer comprises a plurality of ferroelectric domain walls that are mobile under an applied electric field; and
    applying an electric field across the at least one ferroelectric layer, thereby altering the volumetric concentration of the plurality of ferroelastic domain walls and causing a shift in the wavelength of a minimum in the infrared reflectance.

2. The method of claim 1, wherein the ferroelectric material comprises lead zirconate titanate.

3. The method of claim 1, wherein the ferroelectric material comprises lead magnesium niobate-lead titanate, lead lanthanum zirconate titanate, lead niobate zirconate titanate, lead indium niobate-lead titanate, bismuth ferrite, bismuth samarium ferrite, bismuth cobalt ferrite, barium titanate, barium strontium titanate, barium calcium zirconate titanate, barium titanate zirconate, bismuth sodium niobate, or bismuth sodium niobate-barium titanate.

4. The method of claim 1, wherein the at least one ferroelectric layer comprises a ferroelectric bilayer heterostructure.

5. The method of claim 4, wherein the ferroelectric bilayer heterostructure comprises a rhombohedral symmetry lead zirconate titanate layer and a tetragonal symmetry lead zirconate titanate layer.

6. The method of claim 1, wherein the thickness of the at least one ferroelectric layer is less than 3 microns.

7. The method of claim 1, further comprising an optical grating, nanoantenna, or metasurface on the top surface of the at least one ferroelectric layer.

* * * * *